United States Patent
Okawa et al.

(10) Patent No.: US 9,831,121 B2
(45) Date of Patent: Nov. 28, 2017

(54) SEMICONDUCTOR MEMORY DEVICE WITH CONTACT PLUGS EXTENDING INSIDE CONTACT CONNECTION PORTIONS

(71) Applicant: Toshiba Memory Corporation, Minato-ku (JP)

(72) Inventors: Takamasa Okawa, Yokkaichi (JP); Shigeki Kobayashi, Kuwana (JP); Kei Sakamoto, Nagoya (JP); Ryosuke Sawabe, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/077,305

(22) Filed: Mar. 22, 2016

(65) Prior Publication Data

US 2017/0077026 A1  Mar. 16, 2017

Related U.S. Application Data

(60) Provisional application No. 62/218,250, filed on Sep. 14, 2015.

(51) Int. Cl.
  *H01L 23/528* (2006.01)
  *H01L 27/115* (2017.01)
  *H01L 21/768* (2006.01)
  *H01L 27/11556* (2017.01)

(52) U.S. Cl.
  CPC .. *H01L 21/76843* (2013.01); *H01L 21/76897* (2013.01); *H01L 23/528* (2013.01); *H01L 27/11556* (2013.01)

(58) Field of Classification Search
  None
  See application file for complete search history.

(56) References Cited

U.S. PATENT DOCUMENTS

| 7,799,672 B2 | 9/2010 | Hashimoto et al. |
| 8,435,857 B2 | 5/2013 | Kiyotoshi |
| 2013/0234338 A1 | 9/2013 | Uenaka et al. |
| 2016/0172296 A1* | 6/2016 | Lim ...................... H01L 23/485 257/773 |

FOREIGN PATENT DOCUMENTS

| JP | 2010-192646 | 9/2010 |
| JP | 2012-151187 | 8/2012 |
| JP | 2013-187339 | 9/2013 |

* cited by examiner

*Primary Examiner* — Marc Armand
*Assistant Examiner* — Younes Boulghassoul
(74) *Attorney, Agent, or Firm* — Oblon, McClelland, Maier & Neustadt, L.L.P.

(57) ABSTRACT

According to an embodiment, a semiconductor memory device includes a plurality of first conductive layers disposed above a substrate in a laminating direction. A stepped wiring area includes a second conductive layer electrically connected to the first conductive layer. The second conductive layer has an end portion as a contact connection portion. A contact plug is connected to the contact connection portion. The contact plug extends in the laminating direction. The contact plug includes a first member and a second member. The first member extends in the laminating direction. The second member extends in a direction intersecting with the laminating direction inside the contact connection portion.

10 Claims, 20 Drawing Sheets

SEMICONDUCTOR MEMORY DEVICE WITH CONTACT PLUGS EXTENDING INSIDE CONTACT CONNECTION PORTIONS

CROSS REFERENCE TO RELATED APPLICATIONS

This application is based on and claims the benefit of priority from prior U.S. Provisional Patent Application No. 62/218,250, filed on Sep. 14, 2015, the entire contents of which are incorporated herein by reference.

BACKGROUND

Field

Embodiments described herein relate generally to a semiconductor memory device and a manufacturing method thereof.

Description of the Related Art

A semiconductor memory device such as a NAND flash memory is required to be further downsized and has a larger storage capacity. While scaling down for enhancing the capacity has been done, on the other hand, there has been proposed a structure in which semiconductor elements such as memory cells are disposed three-dimensionally. For example, in such three-dimensional semiconductor memory device, the memory cells are disposed in a laminating direction. Conductive layers extend from the respective memory cells, which are disposed in the laminating direction.

In such three-dimensional semiconductor memory device, the laminated conductive layers are connected to contacts on their top surfaces. As the miniaturization has been developed, the reduction in contact diameter is desired. However, the small contact diameter increases a contact resistance between the contact and the conductive layer.

DETAILED DESCRIPTION

A semiconductor memory device according to an embodiment described later includes a plurality of first conductive layers disposed above a substrate in a laminating direction. A wiring portion includes a second conductive layer electrically connected to the first conductive layer. The second conductive layer has an end portion as a contact connection portion. A contact plug is connected to the contact connection portion. The contact plug extends in the laminating direction. The contact plug includes a first member and a second member. The first member extends in the laminating direction. The second member extends in a direction intersecting with the laminating direction inside the contact connection portion.

The following describes semiconductor memory devices according to embodiments with reference to the accompanying drawings. Here, these embodiments are only examples. For example, a nonvolatile semiconductor memory device described below has a structure where a memory string extends in a straight line in the vertical direction with respect to a substrate. The similar structure is also applicable to the structure having a U shape where a memory string is folded to the opposite side in the middle. The respective drawings of the nonvolatile semiconductor memory devices used in the following embodiments are schematically illustrated. The thickness, the width, the ratio, and a similar parameter of the layer are not necessarily identical to actual parameters.

The following embodiments relate to a nonvolatile semiconductor memory device (a three-dimensional NAND flash memory) in a structure where a plurality of metal-oxide-nitride-oxide-semiconductor (MONOS) type memory cells (transistors) is disposed in a height direction. The MONOS type memory cell includes: a semiconductor film disposed in a columnar shape vertical to the substrate as a channel, and a gate electrode film disposed on the side surface of the semiconductor film via a charge accumulation layer. However, a similar structure is also applicable to another type, for example, a semiconductor-oxide-nitride-oxide-semiconductor (SONOS) type memory cell, a metal-aluminum oxide-nitride-oxide-semiconductor (MANOS) type memory cell, a memory cell that uses hafnium oxide ($HfO_x$) or tantalum oxide ($TaO_x$) as an insulating layer, or a floating-gate type memory cell.

First Embodiment

First, the following describes an overall structure of the semiconductor memory device according to the first embodiment.

Figure 1:
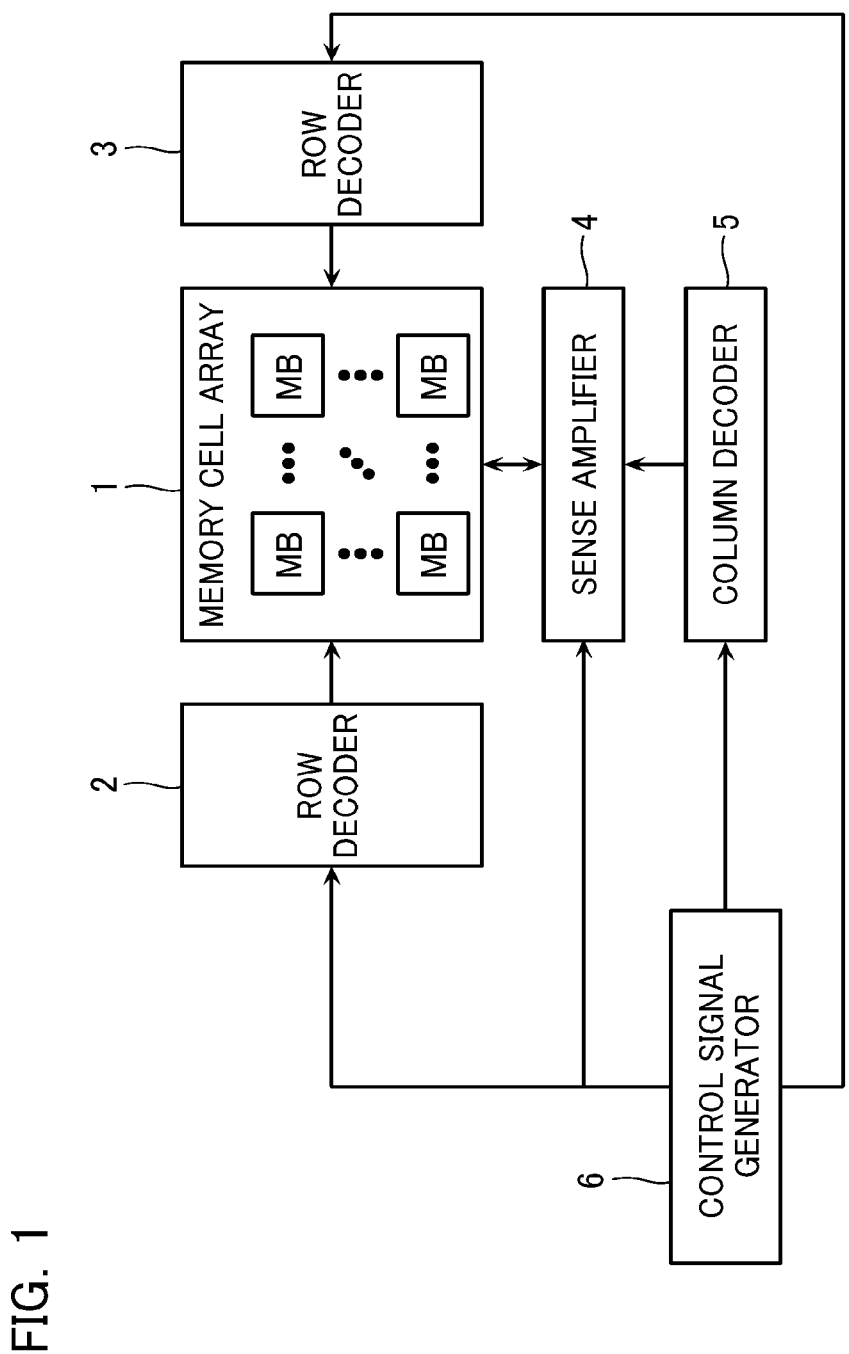
FIG. 1 is a diagram illustrating a function block of a semiconductor memory device according to a first embodiment.

FIG. 1 is a diagram illustrating a function block of a semiconductor memory device according to a first embodiment. This semiconductor memory device includes a memory cell array 1, row decoders 2 and 3, a sense amplifier 4, a column decoder 5, and a control signal generator 6.

The memory cell array 1 includes a plurality of memory blocks MB. The memory blocks MB each include a plurality of memory transistors. The memory transistors are a plurality of memory cells MC that are three-dimensionally disposed. The memory block MB is the minimum unit of data erasure operation.

The row decoders 2 and 3 decode retrieved block address signals or similar signals to control a writing operation and a reading operation of data in the memory cell array 1. The sense amplifier 4 detects electric signals flowing through a bit line during the reading operation and amplifies the electric signals. The column decoder 5 decodes column address signals to control the sense amplifier 4. The control signal generator 6 steps up a reference voltage to generate a high voltage used for the writing operation and the erasure operation. Besides, the control signal generator 6 generates control signals to control the row decoders 2 and 3, the sense amplifier 4, and the column decoder 5.

Figure 2:
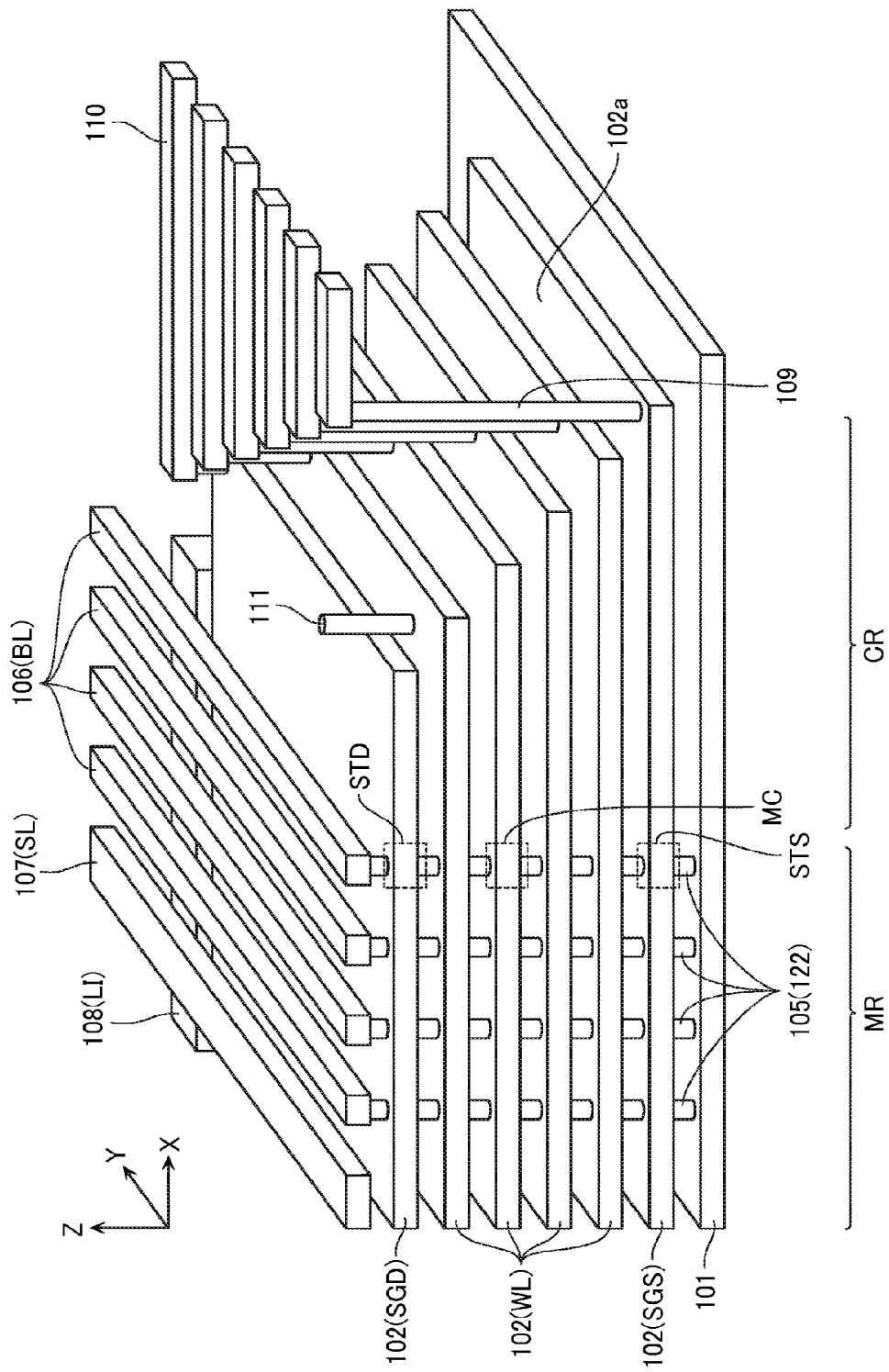
FIG. 2 is a schematic perspective view illustrating a structure of a part of a memory cell array of the semiconductor memory device according to the first embodiment.

Next, the following describes the schematic structure of the memory cell array 1 according to the embodiment with reference to FIG. 2. FIG. 2 is a schematic perspective view illustrating the structure of a part of the memory cell array 1. FIG. 2 omits illustrations of a part of structures for simplifying the description. For simplifying the illustration, the count of respective wirings also differs from those of other drawings.

As illustrated in FIG. 2, the memory cell array 1 according to the first embodiment includes a substrate 101 and a plurality of conductive layers 102. The conductive layers 102 are laminated on the substrate 101 in a Z direction. The memory cell array 1 has a plurality of memory shafts 105 extending in the Z direction. As illustrated in FIG. 2, the intersection portions of the conductive layers 102 and the memory shafts 105 function as a source side selection gate transistor STS, the memory cell MC, or a drain side selection gate transistor STD. The conductive layer 102 is a conductive layer made of, for example, tungsten (W) or polysilicon. The conductive layer 102 functions as a word line WL, a source side selection gate line SGS, and a drain side selection gate line SGD.

As illustrated in FIG. 2, the plurality of conductive layers 102 include wiring portions, which are formed into a stepped pattern, on the end portions in the X direction. The following designates an area at which the memory cell MC or a similar component is disposed as a memory area MR. Apart where the conductive layers 102 are formed into the stepped pattern by extracting the conductive layers 102 from this memory area MR is referred to as a stepped wiring area CR.

The conductive layers 102 in the stepped wiring area CR include contact connection portions 102a. The contact connection portion 102a does not face the lower surface of the conductive layer 102, which is positioned on the upper layer of the contact connection portion 102a. The conductive layer 102 is connected to a contact plug 109 at this contact connection portion 102a. A wiring 110 is disposed at the upper end of the contact plug 109. The contact plug 109 and the wiring 110 are formed of conductive layers made of, for example, tungsten.

As illustrated in FIG. 2, the memory cell array 1 according to the first embodiment includes a support pillar 111. The support pillar 111 is disposed so as to have a longitudinal direction in a laminating direction (Z direction) of a laminated body formed of the plurality of conductive layers 102 and the interlayer insulating films between the conductive layers 102. This support pillar 111 is formed to maintain the posture of the laminated body during the manufacturing process for this laminated structure formed of the conductive layers 102 and the interlayer insulating films between the conductive layers 102. When the material of the conductive layer 102 is metallic material such as tungsten, the conductive layers 102 can be formed by the following processes as described later. That is, the interlayer insulating films and sacrificial films are laminated. Then, the sacrificial films are removed by wet etching or a similar method. Afterward, the conductive films are embedded into voids formed by removing the sacrificial films. This ensures the laminated structure constituted of the conductive layers and the interlayer insulating films to be formed. When performing such processes, to prevent the interlayer insulating film from collapsing after the sacrificial films are removed, the above-described support pillar 111 is disposed. FIG. 2 representatively illustrates only the one support pillar 111. However, as described later, the actual device can include more of the support pillars 111.

As illustrated in FIG. 2, the memory cell array 1 according to the first embodiment includes a conductive layer 108. The conductive layer 108 opposes the side surfaces of the plurality of conductive layers 102 in the Y direction and extends in the X direction. The lower surface of the conductive layer 108 is in contact with the substrate 101. The conductive layer 108 is a conductive layer made of, for example, tungsten (W). The conductive layer 108 functions as a source contact LI.

The material of the conductive layer 102, as well as the above-described tungsten (W), is possibly constituted of a conductive layer such as WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, and $FeSi_x$.

As illustrated in FIG. 2, the memory cell array 1 according to the first embodiment includes a plurality of conductive layers 106 and a conductive layer 107. The plurality of conductive layers 106 and the conductive layer 107 disposed above the plurality of conductive layers 102 and memory shafts 105. The plurality of conductive layers 106 are disposed in the X direction. The plurality of conductive layers 106 and the conductive layers 107 extend in the Y direction. The memory shafts 105 are each connected to the lower surfaces of the conductive layers 106. The conductive layer 106 is, for example, constituted of the conductive layer such as tungsten (W) and functions as a bit line BL. The conductive layer 108 is connected to the lower surfaces of the conductive layers 107. The conductive layer 107 is, for example, constituted of the conductive layer such as tungsten (W) and functions as a source line SL.

Figure 3:
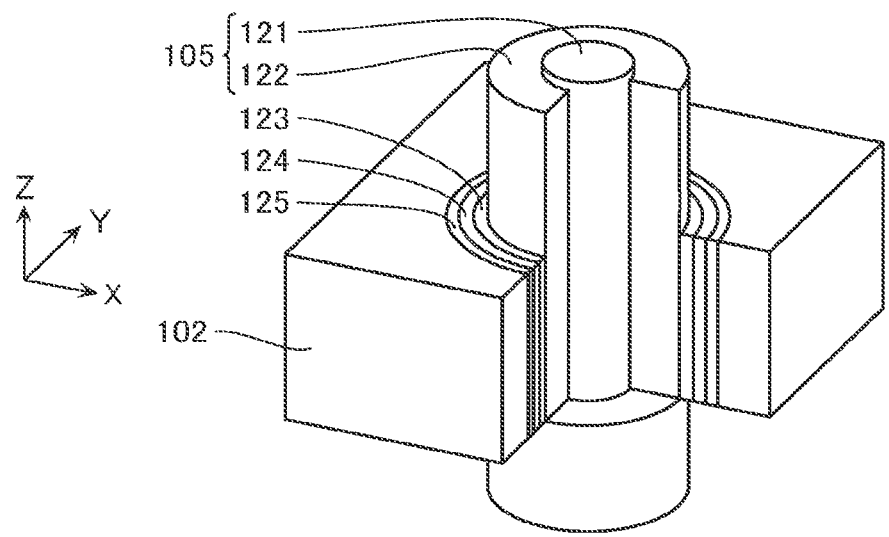
FIG. 3 is a schematic diagram illustrating a schematic structure of a memory cell MC of the semiconductor memory device according to the first embodiment.

Next, with reference to FIG. 3, the following describes the schematic structure of the memory cell MC according to the first embodiment. FIG. 3 is a schematic perspective view illustrating the structure of the memory cell MC. FIG. 3 illustrates the structure of the memory cell MC. Note that the source side selection gate transistor STS and the drain side selection gate transistor STD may also be configured similar to the memory cell MC. FIG. 3 omits a part of the structure.

As illustrated in FIG. 3, the memory cell MC is disposed at a portion where the conductive layer 102 intersects with the memory shaft 105. The memory shaft 105 includes a core insulating layer 121 and a columnar semiconductor layer 122. The semiconductor layer 122 covers the sidewall of the core insulating layer 121. Moreover, between the semiconductor layer 122 and the conductive layer 102, a memory gate insulating film is disposed. The memory gate insulating film includes a tunnel insulating layer 123, a charge accumulation layer 124, and a laminated film 125.

The core insulating layer 121 is constituted of, for example, an insulating layer such as silicon oxide ($SiO_2$). The semiconductor layer 122 is constituted of, for example, a semiconductor layer such as polysilicon. The semiconductor layer 122 functions as a channel for the memory cell MC, the source side selection gate transistor STS, and the drain side selection gate transistor STD. The tunnel insulating layer 123 is constituted of, for example, an insulating layer such as silicon oxide ($SiO_2$). The charge accumulation layer 124 is constituted of, for example, an insulating layer such as silicon nitride (SiN) that can accumulate charges. The laminated film 125 is constituted of, for example, laminated films formed of silicon oxide ($SiO_2$) as a block insulating film, a high-dielectric film, and a barrier metal film.

The material of the semiconductor layer 122, as well as the above-described polysilicon, is possibly constituted of, for example, a semiconductor such as SiGe, SiC, Ge, and C. Surfaces at which the semiconductor layer 122 is in contact with the substrate 101 and the conductive layers 106, silicide may be formed. As such silicide, for example, Sc, Ti, VCr, Mn, Fe, Co, Ni, Cu, Zn, Rh, Pd, Ag, Cd, In, Sn, La, Hf, Ta, W, Re, Os, Ir, Pt, and Au are possibly used. Additionally, Sc, Ti, VCr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, Au, or a similar material may be added to the silicide thus formed.

The tunnel insulating layer 123 is possibly formed of a material, for example, oxide and oxynitride, in addition to the above-described silicon oxide ($SiO_2$). The oxide constituting the tunnel insulating layer 123 and the laminated film 125 is possibly $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or a similar material. The oxide constituting the tunnel insulating layer 123 and the laminated film 125 may be $AB_2O_4$. Note that A and B described here are identical or different elements and one of elements among Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $Co_{1+x}Al_{2-x}O_{4+y}$, $MnO_x$, or a similar material.

The oxide constituting the tunnel insulating layer 123 and the laminated film 125 may be $ABO_3$. Note that A and B described here are identical or different elements and one of elements among Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is, $LaAlO_3$, $SrHfO_3$, $SrZrO_3$, $SrTiO_3$, or a similar material.

The oxynitride constituting the tunnel insulating layer 123 and the laminated film 125 is possibly, for example, SiON, AlON, YON, LaON, GdON, CeON, TaON, HfON, ZrON, TION, LaAlON, SrHfON, SrZrON, SrTiON, HfSiON, HfAlON, ZrSiON, ZrAlON, and AlSiON.

The oxynitride constituting the tunnel insulating layer 123 and the laminated film 125 may be a material constituted by replacing some of oxygen elements of the respective materials described above as an oxide constituting the tunnel insulating layer 123 and the laminated film 125 with a nitrogen element.

As the materials for the tunnel insulating layer 123 and the laminated film 125, $SiO_2$, SiN, $Si_3N_4$, $Al_2O_3$, SiON, $HfO_2$, HfSiON, $Ta_2O_5$, $TiO_2$, or $SrTiO_3$ is preferable.

In particular, an Si-based insulating film such as $SiO_2$, SiN, and SiON includes an insulating film whose respective concentrations of the oxygen element and the nitrogen element are $1\times10^{18}$ atoms/$cm^3$ or more. Note that a barrier height of the plurality of insulating layers differ from one another.

The tunnel insulating layer 123 and the laminated film 125 may contain impurity atoms forming defective levels or semiconductor/metal dot (a quantum dot).

Figure 4:
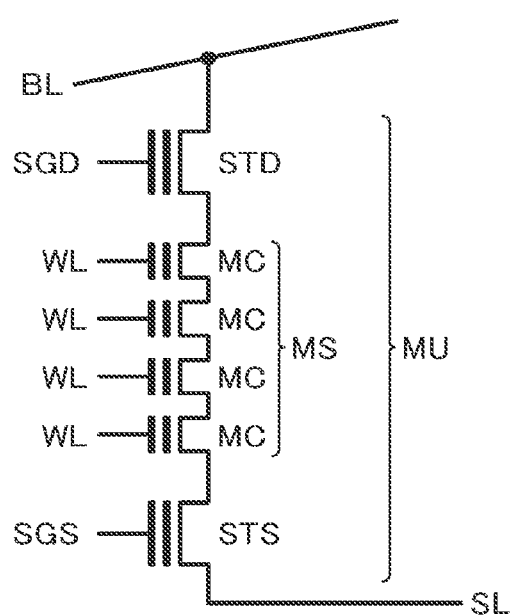
FIG. 4 is an equivalent circuit diagram of a memory unit MU of the semiconductor memory device according to the first embodiment.

The connection of the memory cell MC and the selection gate transistors STD and STS with the above-described structure in series configures a memory unit MU as illustrated in FIG. 4. That is, the memory unit MU includes a memory string MS, the source side selection gate transistor STS, and the drain side selection gate transistor STD. The memory string MS is formed of the plurality of memory cells MC connected in series. The source side selection gate transistor STS and the drain side selection gate transistor STD are connected to both ends of the memory string MS. Some of the plurality of memory cells MC in the memory string MS can be dummy cells not used for data storage. The count of dummy cells can be set to any given count.

Figure 5:
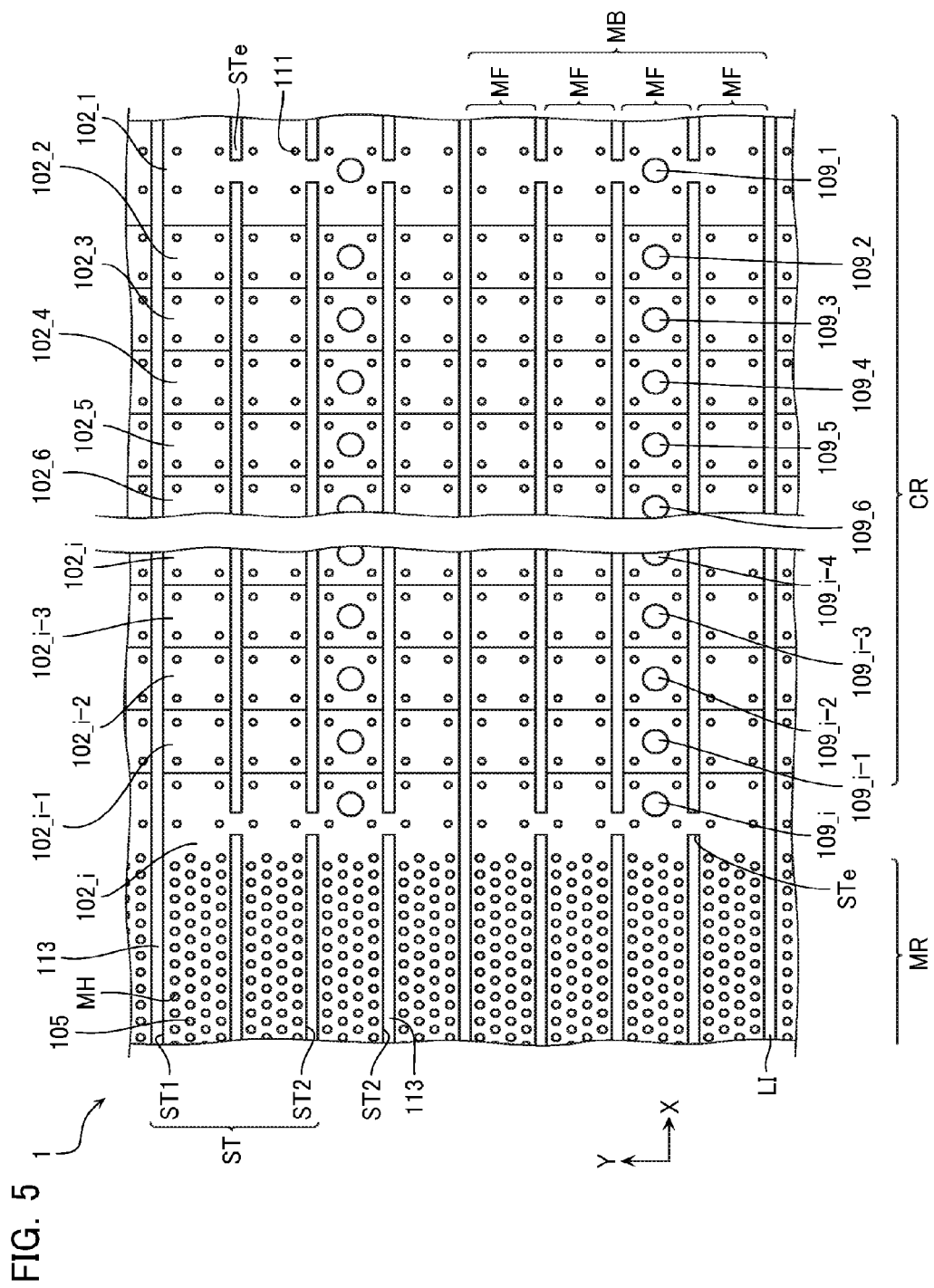
FIG. 5 is a plan view describing detailed structures of a memory area MR and a stepped wiring area CR of the semiconductor memory device according to the first embodiment.
Figure 6:
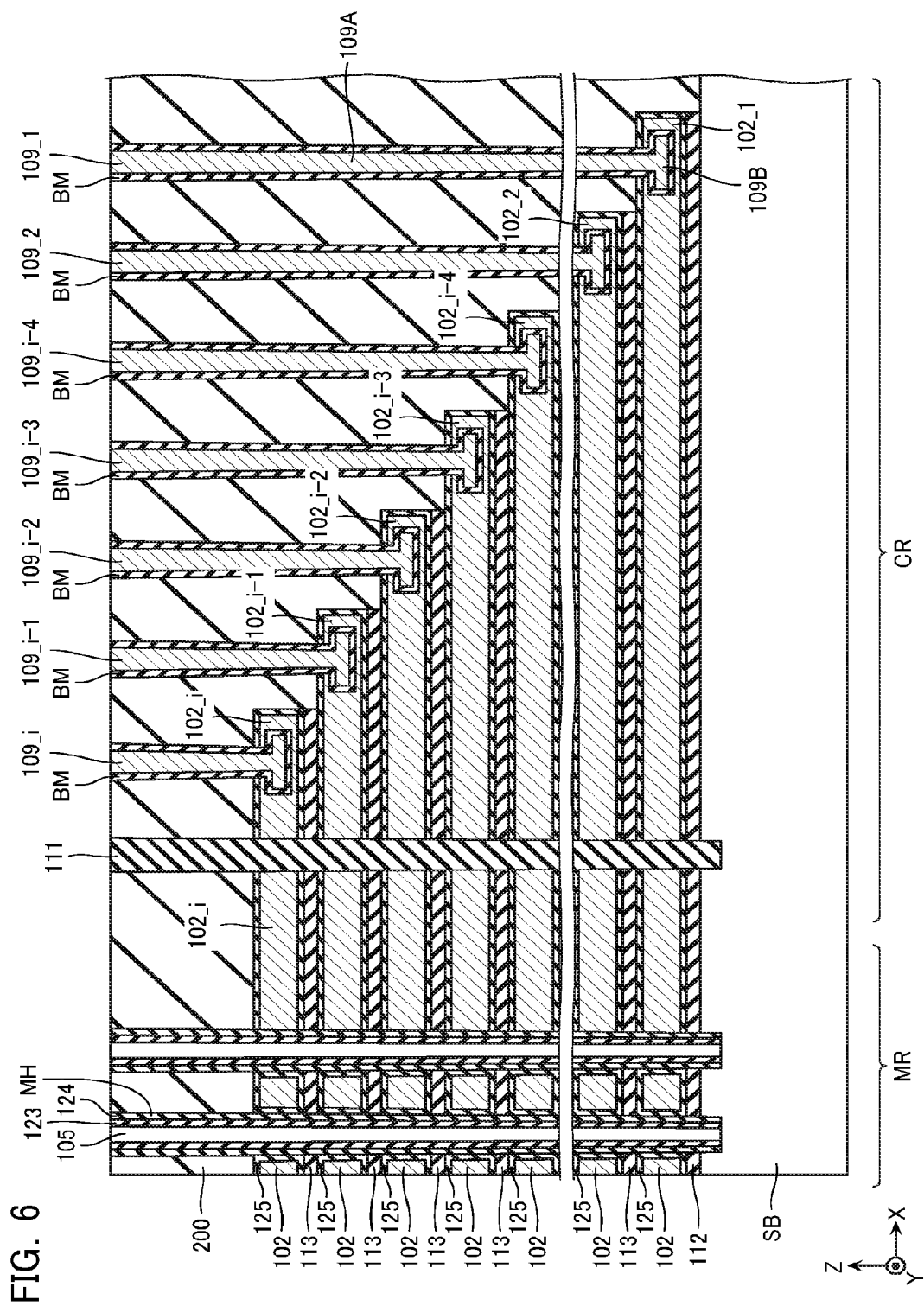
FIG. 6 is a cross-sectional view describing detailed structures of the memory area MR and the stepped wiring area CR of the semiconductor memory device according to the first embodiment.

Next, with reference to FIG. 5 to FIG. 6, the following describes details of the structure of the memory area MR and the stepped wiring area CR of the semiconductor memory device according to the first embodiment. FIG. 5 is a plan view illustrating the structures of the memory area MR and the stepped wiring area CR. FIG. 6 is a cross-sectional view of the memory area MR and the stepped wiring area CR along the X-Z plane in FIG. 5. FIG. 5 and FIG. 6 differ from the numbers of word lines WL and the selection gate lines SGD and SGS aligned in the laminating direction (the Z direction) from those of the schematic diagram in FIG. 2. In the cross-sectional view of FIG. 6, for convenience, the memory shaft 105 and the support pillar 111 are illustrated as the one cross section.

As illustrated in FIG. 5, the memory cell array 1 according to the first embodiment includes the memory area MR and the stepped wiring area CR. The memory unit MU is formed at the memory area MR. The stepped wiring area CR extends from the memory area MR.

As illustrated in FIG. 6, in the memory area MR, a plurality of (i pieces) of the conductive layers 102 (102_1 to 102_i) are laminated on the substrate 101 sandwiching interlayer insulating films 112 and 113.

A large count of memory holes MH are formed in the memory area MR so as to penetrate the laminated body of these conductive layers 102 and interlayer insulating films 112 and 113. In this memory hole MH, the above-described memory shaft 105 is formed via the tunnel insulating layer 123 and the charge accumulation layer 124 (see FIG. 6). That is, the memory shaft 105 is formed such that the peripheral area of the memory shaft 105 is surrounded by the laminated body of the conductive layer 102 and the interlayer insulating films 112 and 113.

As illustrated in FIG. 6, the laminated films 125 are formed not the inside of the memory holes MH but so as to cover the peripheral areas of the conductive layers 102_1 to 102_i. That is, in the example of FIG. 6, the laminated films 125 are formed so as to cover the top and bottom surfaces and the side surfaces of the conductive layers 102_1 to 102_i. However, similar to the tunnel insulating layer 123 and the charge accumulation layer 124, the laminated film 125 may be disposed only the peripheral area of the memory shaft 105. The upper end of the memory shaft 105 is connected to the above-described conductive layer 106 (the bit line BL) via a contact wiring or a similar wiring.

In the example illustrated in FIG. 5, the memory holes MH are disposed in a houndstooth pattern in the X-Y plane. The disposition of the memory holes MH in the XY direction can be appropriately adjusted into a triangular disposition, a square disposition, or a similar disposition.

As illustrated in FIG. 5 and FIG. 6, a large count of the above-described support pillars 111 are formed at the stepped wiring area CR. The contact plugs 109 (109_1 to 109_i) are connected to the exposed portions (the contact connection portions 102a) of the respective conductive layers 102 constituting the stepped wiring area CR. The upper ends of the contact plugs 109 are connected to upper layer wirings M1. Through such upper layer wirings M1 and wiring layers (not illustrated), the contact plug 109 is connected to an external circuit. This upper layer wiring M1 functions as the wiring 110 in FIG. 2.

The stepped wiring area CR has a structure of forming the above-described conductive layers 102 and interlayer insulating films 113 into the stepped pattern. As a result of formed into the stepped pattern, the conductive layers 102 each include the contact connection portion 102a not covered with the conductive layer upper than this layer and is exposed. The contact connection portion 102a can be connected to the contact plug 109. The upper end of the contact plug 109 is connected to the upper layer wiring M1.

As illustrated in FIG. 5, a large count of slits ST (ST1 and ST2) with the longitudinal direction in the X direction are formed at the memory area MR and the stepped wiring area CR. The interlayer insulating film 113 is embedded or the above-described source contact LI is embedded into the slit ST via the interlayer insulating film. That is, by being embedded into the slit ST, the interlayer insulating film 113 has a role to electrically insulate and separate the conductive layers 102 positioned at both sides. When forming the conductive layer 102, this slit ST is formed to remove the sacrificial film, which will be described later, by etching.

As illustrated in FIG. 5, the slit ST extends with the X direction as the longitudinal direction. Additionally, the slit ST is formed so as to separate the laminated body of the conductive layers 102 and the interlayer insulating films from the surface to the bottom. Thus, the slit ST separates the conductive layers 102_2 to 102_i in the memory area MR and the stepped wiring area CR in the Y direction. The slit ST has two types of slits ST1 and ST2. All the slits ST1 and ST2 are formed to extend from the surface of the conductive layer 102_i to the substrate 101. This slit ST1 divides the memory area MR and the stepped wiring area CR into the plurality of memory blocks MB. Furthermore, the slit ST2 divides the one memory block MB into a plurality of memory fingers MF.

The slit ST1 is a slit formed between the two memory blocks MB. The slit ST2 is a slit formed between the two memory fingers MF in the one memory block MB. The slit ST1 separates the two memory blocks MB up to the conductive layer 102_1, which is the lowest layer. Meanwhile, the slit ST2 has a terminating end portion STe at any position in the stepped wiring area CR. In the example illustrated in FIG. 5, the terminating end portions STe are formed at the conductive layer 102_i, which is the uppermost layer, and at the conductive layer 102_1, which is the lowermost layer. The slits ST2 are continuously formed opposed to one another sandwiching the terminating end portion in the X direction. In view of this, the slit ST2 does not electrically separate the conductive layers 102 in the adjacent memory fingers MF. The adjacent memory fingers MF are electrically connected to one another at the parts of the terminating end portions STe (More specifically, at the position between the two terminating end portions STe disposed alongside in the X direction, the conductive layer 102 disposed at a first side, which is the Y direction viewed from the slit ST2, and the conductive layer 102 disposed at a second side, which is the Y direction viewed from the slit ST2, are electrically connected).

Figure 24:
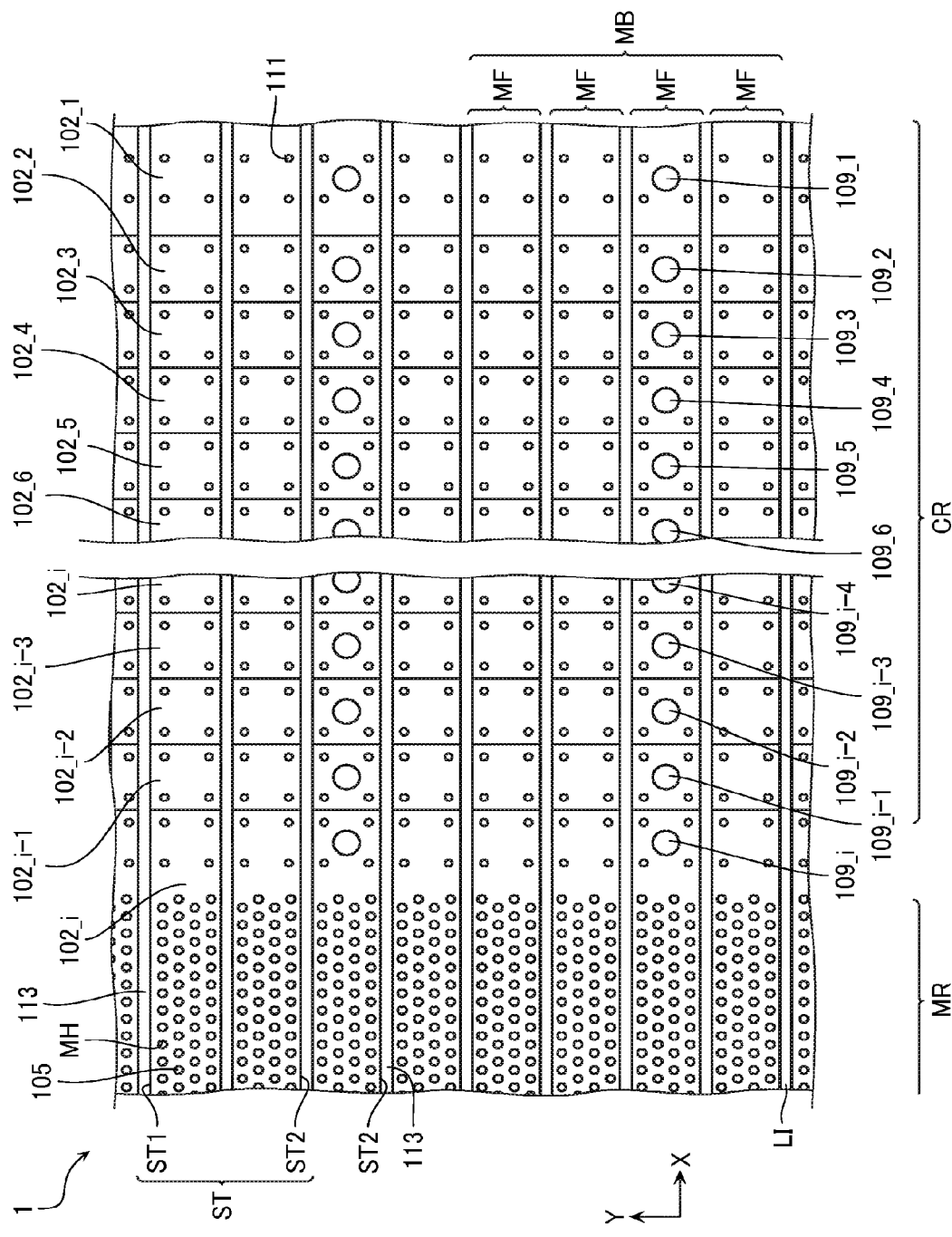
FIG. 24 illustrates a modification of the first and second embodiments.

Thus, the slit ST2 includes the terminating end portion STe due to the following reason. The terminating end portion STe does not electrically separate the plurality of memory fingers MF, which are included in the one memory block MB, but keeps the memory fingers MF connected, thus restraining the number of the required contact plugs. Obviously, the positions at which the terminating end portions STe are formed are not limited to the example illustrated in the drawing. For example, the terminating end portion STe can be formed only at the conductive layer 102_1, which is the lowermost layer. Similar to the slit ST1, ST2 can also have a structure not including the terminating end portion STe (see FIG. 24).

As illustrated in FIG. 6, the contact plug 109 includes a first member 109A and a second member 109B. The first member 109A extends with the longitudinal direction as the laminating direction. The second member 109B extends in the X direction, which intersects with the laminating direction, inside the contact connection portion 102a of the conductive layer 102. The lower end of the first member 109A is connected to the second member 109B. The first member 109A and the second member 109B have an approximately inverted T shape. In other words, the length of the second member 109B along the longitudinal direction (the X direction in the illustrated example) is greater than the diameter of the lower end of the first member 109A. The first member 109A and the second member 109B are formed by the identical embedding processes and are made of the identical material (for example, a metallic material such as tungsten). However, it is also possible to design both with different materials.

Figure 7:
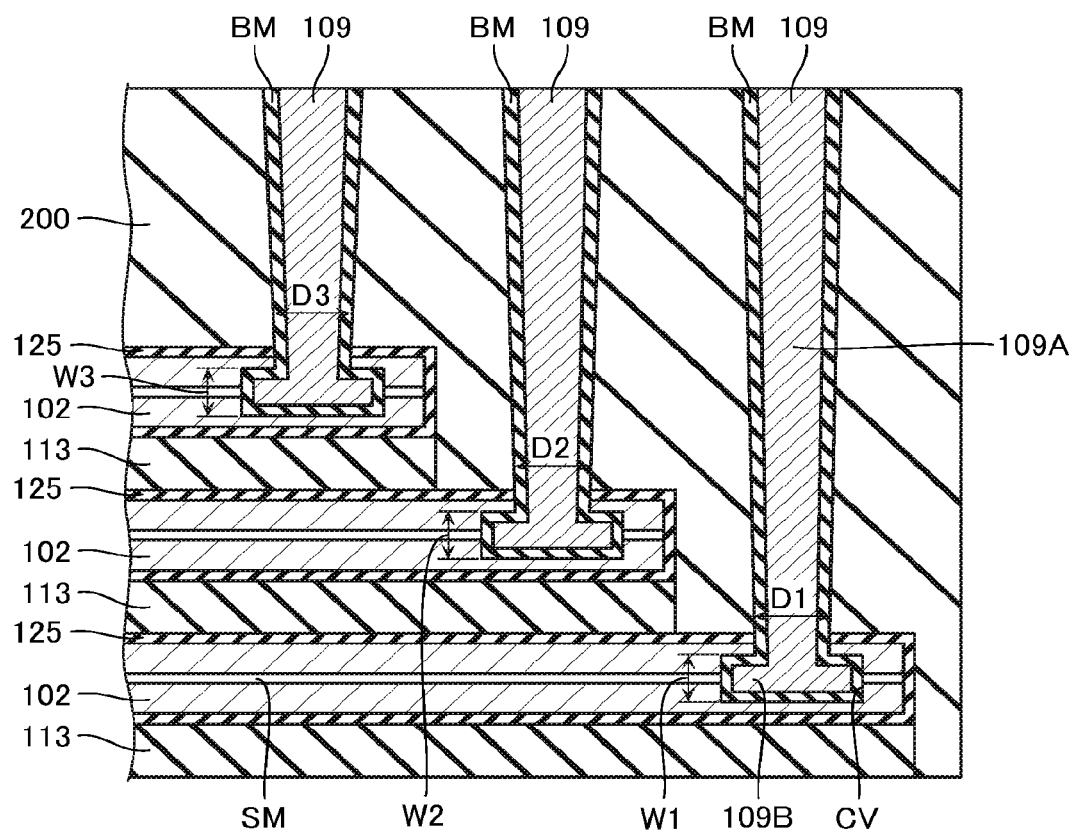
FIG. 7 is a cross-sectional view describing detailed structures of the stepped wiring area CR of the semiconductor memory device according to the first embodiment.

As illustrated in the enlarged view in FIG. 7, the second members 109B are formed so as to embed void portions CV, which are formed in the conductive layers 102 near the contact connection portions 102a, via barrier metal films BM. As illustrated in FIG. 7, during format ion of the conductive layers 102, seams SM are formed inside the conductive layers 102. As described later, the conductive layer 102 can be formed by embedding a metallic material such as tungsten into the void from which the sacrificial film has been removed by a CVD method or a similar method. In this case, there is a possibility that the metallic material is not completely embedded into the voids and the seams SM are formed near the middle in the laminating direction. As the film thickness of the conductive layer 102 decreases (as the thickness of the void decreases), it is difficult to fully embed the metallic material into the void. This is likely to form the seams SM. Such seam SM possibly increases the wiring resistance inside the conductive layer 102.

The embodiment uses this seam SM to perform a process of further expanding the seam SM by etching. This forms the above-described void portion CV. Then, the above-described second members 109B are formed so as to further embed the void portions CV. In the example illustrated in FIG. 7, the void portion CV is formed such that the conductive layer 102 remains on the side surfaces or the lower surface. However, the shape of the void portion CV is not limited to this. The side surface or the lower surface of the void portion CV may reach the laminated film 125.

Although the seams SM are continuously formed in the example illustrated in the drawing, this is merely one example. A part of the seams SM may be discontinuously formed. Not only the one layer, the seams SM may be formed across the plurality of layers in the laminating direction.

The barrier metal film BM is formed so as to surround the outer periphery of the inverted T-shaped contact plug 109, which is formed of the first member 109A and the second member 109B. In other words, the barrier metal films BM are formed along the sidewalls of through-holes, which are used to embed the contact plugs 109, and the void portions CV. The barrier metal film BM constitutes a part of the contact plugs 109 together with the first member 109A and the second member 109B. However, the first member 109A and the second member 109B are formed by the identical embedding process with the identical material. In view of this, the barrier metal film BM is not formed on the connecting portion (the boundary) of the first member 109A and the second member 109B.

Thus, the contact plug 109 of the embodiment includes the second member 109B, which is formed in the void portion CV formed inside the conductive layer 102. This second members 109B can be in contact with the respective conductive layers 102 on the top surfaces, the side surfaces, and/or the lower surfaces. Compared with the case where the top surface of the conductive layer 102 is simply in contact with the lower end of the contact plug 109, this structure allows increasing the contacted area and reducing the contact resistance. The seam SM itself also increases the wiring resistance of the conductive layer 102. However, according to the embodiment, the seams SM are expanded and the void portions CV are formed. The void portion CV is embedded with the metal film as the second member 109B. This reduces the entire length of the seam SM, ensuring reducing the wiring resistance of the conductive layer 102.

The semiconductor memory device according to the embodiment, which includes the above-described stepped wiring area CR, a variation in the resistance value between the plurality of laminated conductive layers 102 can be reduced. That is, as illustrated in FIG. 7, the diameters of the lower ends of the contact holes, which form the contact plugs 109, differ among the plurality of conductive layers 102 (D3>D2>D1). Accordingly, with the structure where the lower end of the contact plug 109 is simply in contact only with the top surface of the conductive layer 102, the wiring resistance significantly differs among the plurality of conductive layers 102. However, this embodiment forms the void portions CV, expanding the contacted area between the contact plug 109 and the conductive layer 102. The thicknesses of the void portion CV and the second member 109B similarly vary (W3>W2>W1). However, the formation of the second member 109B increases the contacted area, allowing significant reduction in the variation of the resistance value.

The following describes a manufacturing method of the non-volatile semiconductor memory device of the first embodiment with reference to FIG. 8 to FIG. 18.

Figure 8:
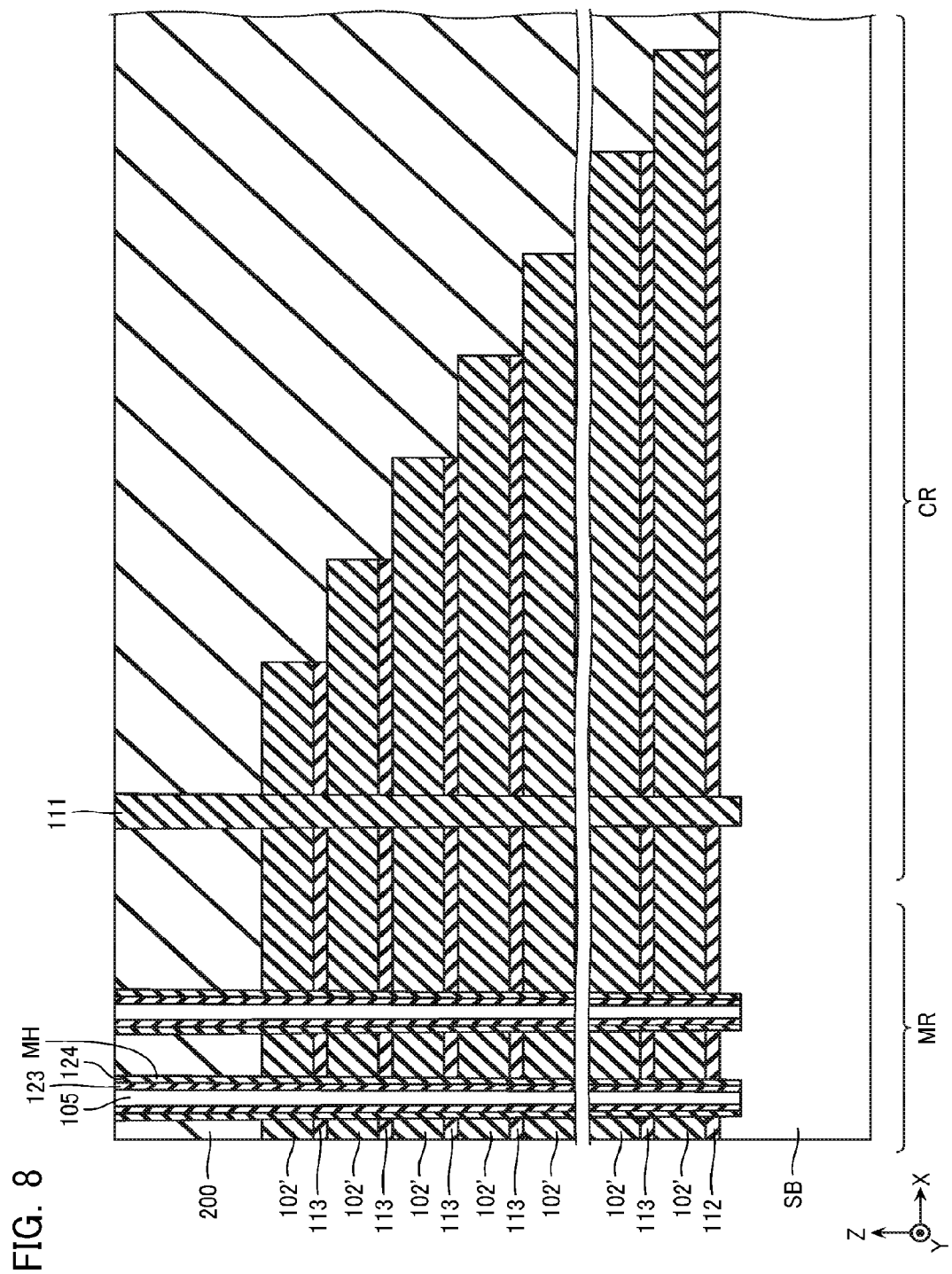
FIG. 8 to FIG. 18 are process drawings illustrating manufacturing processes of the semiconductor memory device according to the first embodiment.

First, as illustrated in FIG. 8, for example, after laminating the interlayer insulating films 112 and 113, which are formed of silicon oxide films, and sacrificial films 102', which are formed of silicon nitride films, in alternation, the end portions are formed into the stepped pattern. The stepped portion can be formed by a method of gradually shifting a resist backward. Afterwards, after covering the entire surface with an interlayer insulating film 200, the memory holes MH, which penetrate the interlayer insulating film 200, are formed. Into the memory hole MH, by the well-known method, the charge accumulation layer 124, the tunnel insulating layer 123, and the memory shaft 105 are embedded using the CVD method or a similar method. Further, a through-hole, which penetrates the stepped wiring area CR, is formed. For example, a silicon oxide film is embedded into this through-hole to form the above-described support pillar 111.

Figure 9:
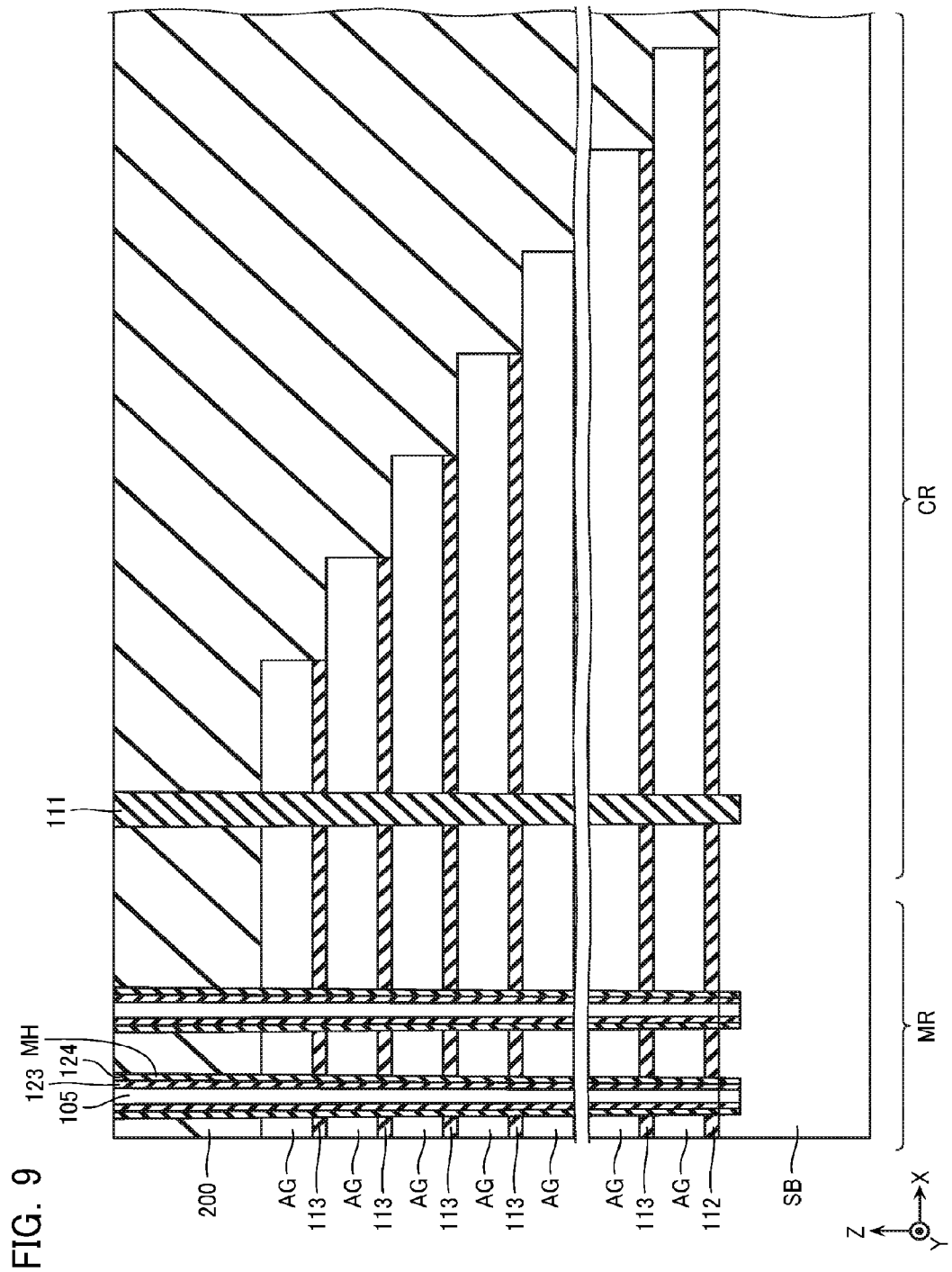

Then, as illustrated in FIG. 9, after forming the slits ST as illustrated in FIG. 7, wet etching is performed using a hot phosphoric acid solution or a similar solution via these slits to remove the sacrificial films 102'.

Figure 10:
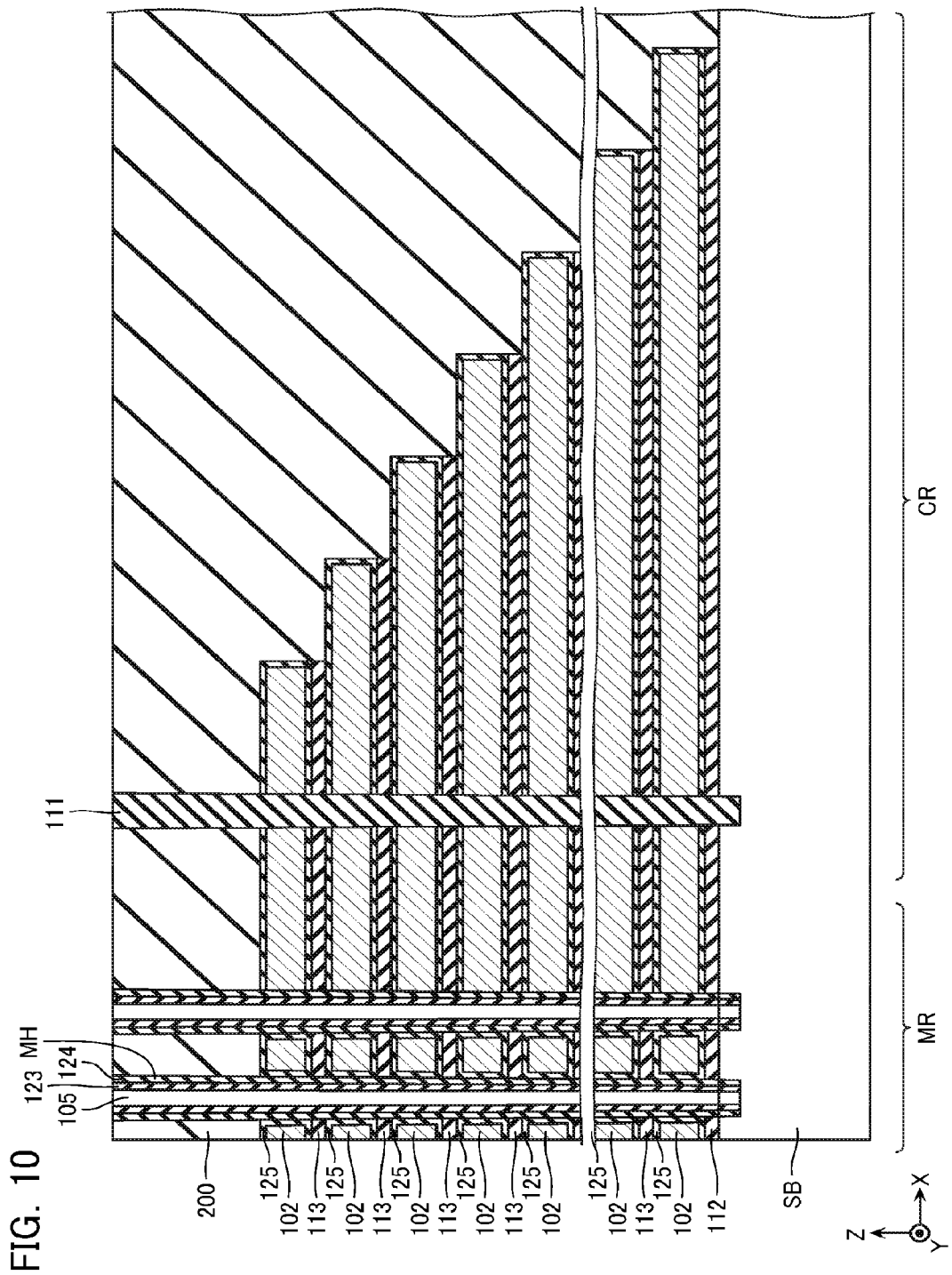
Figure 11:
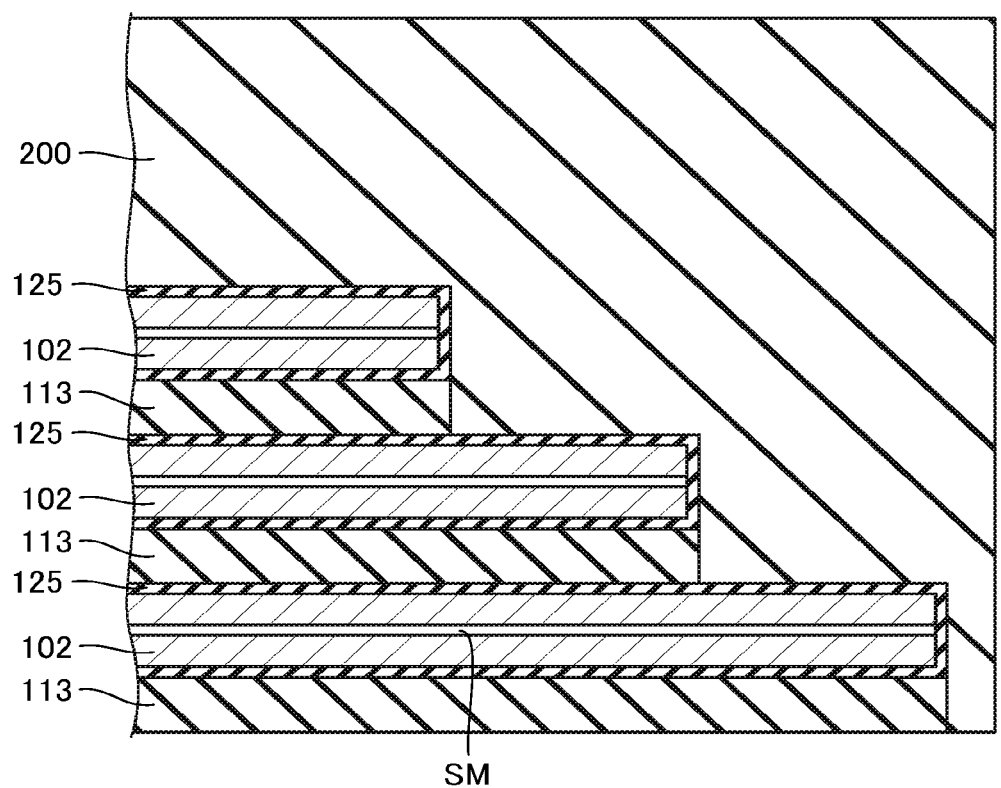

After that, as illustrated in FIG. 10, along the inner walls of air gaps AG, which are formed by the removal of the sacrificial films 102', the laminated films 125 are formed using the CVD method. Furthermore, by the CVD method or a similar method, metal films such as tungsten (W) are deposited in the air gaps AG after the laminated films 125 are formed, thus forming the conductive layers 102. Then, as illustrated in FIG. 11, the conductive layers 102 embedded into the air gap AG do not fully embed the void AG. The seams SM with the longitudinal direction in the horizontal direction are formed at parts near the middle.

Figure 12:
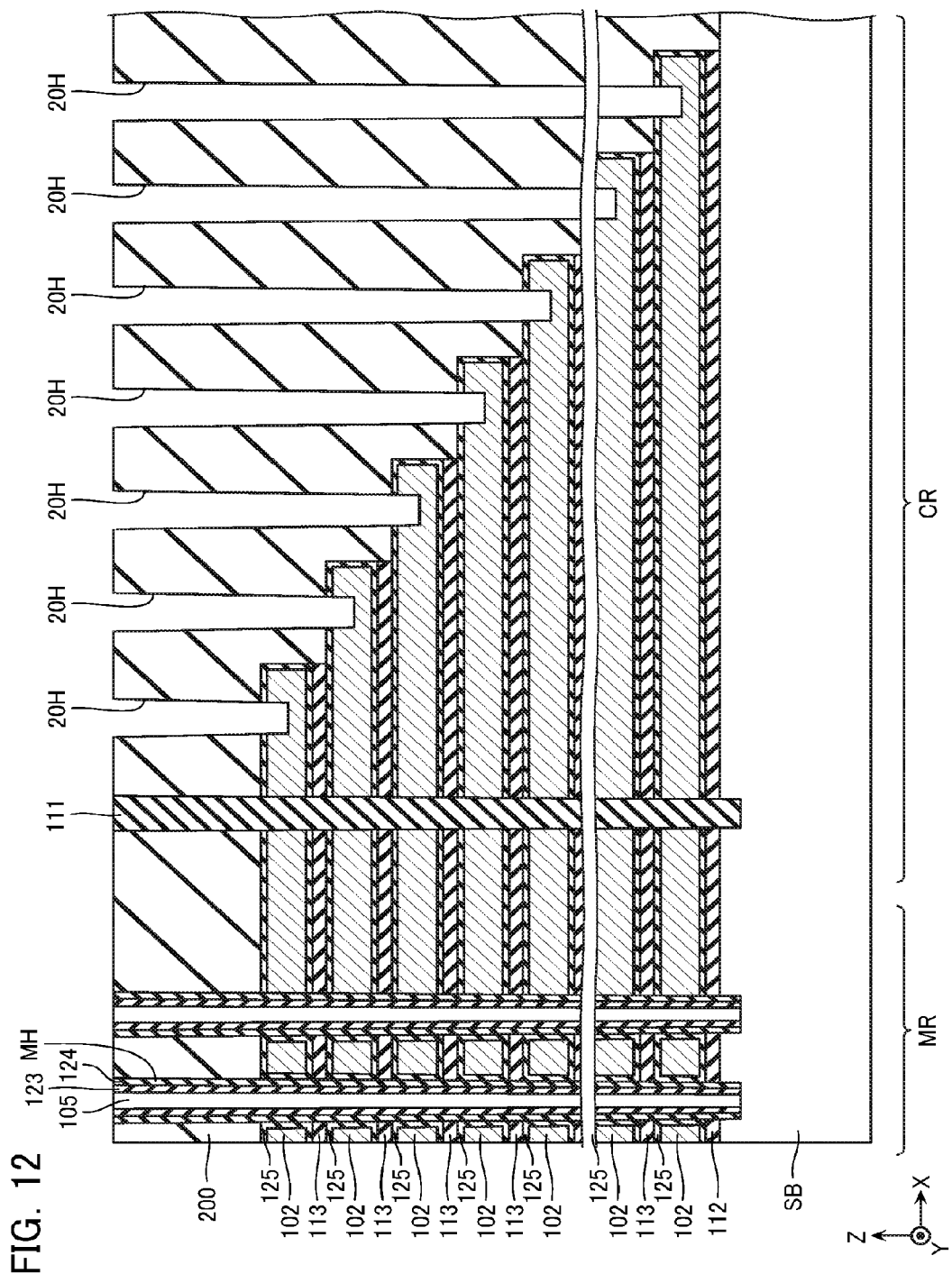
Figure 13:
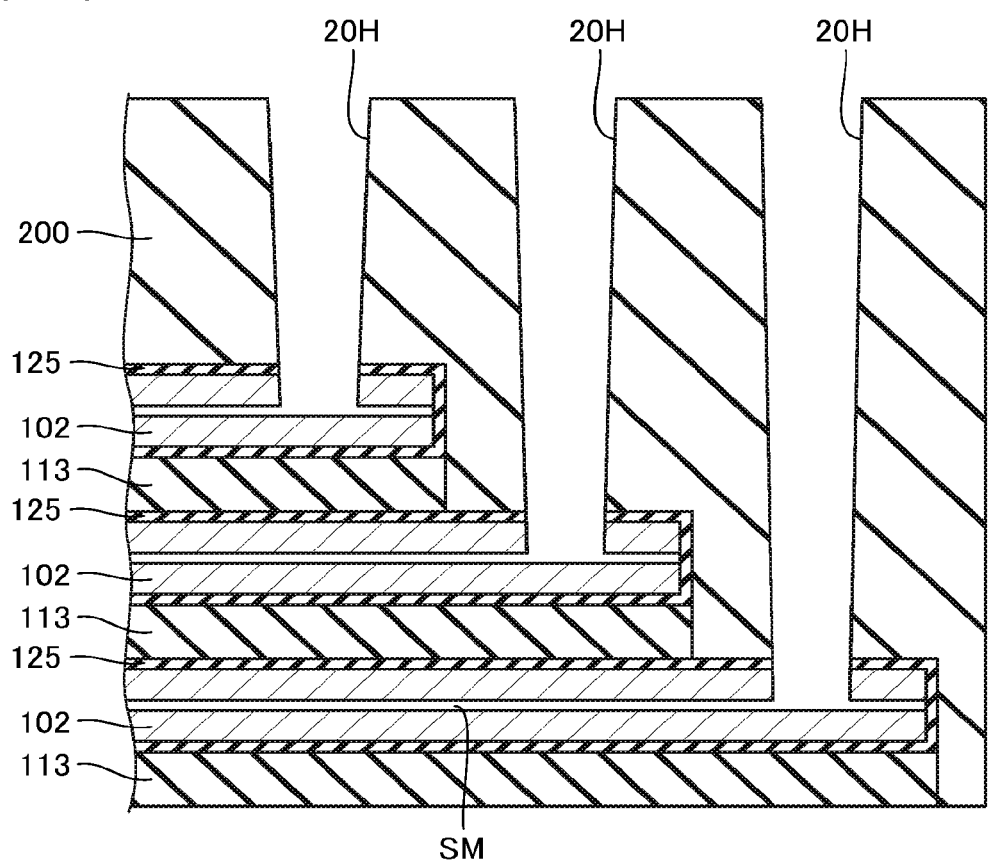

Then, as illustrated in FIG. 12, by photolithography and etching, through-holes 20H, which reach the contact connection portions of the conductive layers 102, are formed. As illustrated in FIG. 13, these through-holes 20H are preferable to be formed such that the lower ends reach the seams SM. However, insofar as processes described later are executable, the through-hole 20H may not reach the seam SM.

Figure 14:
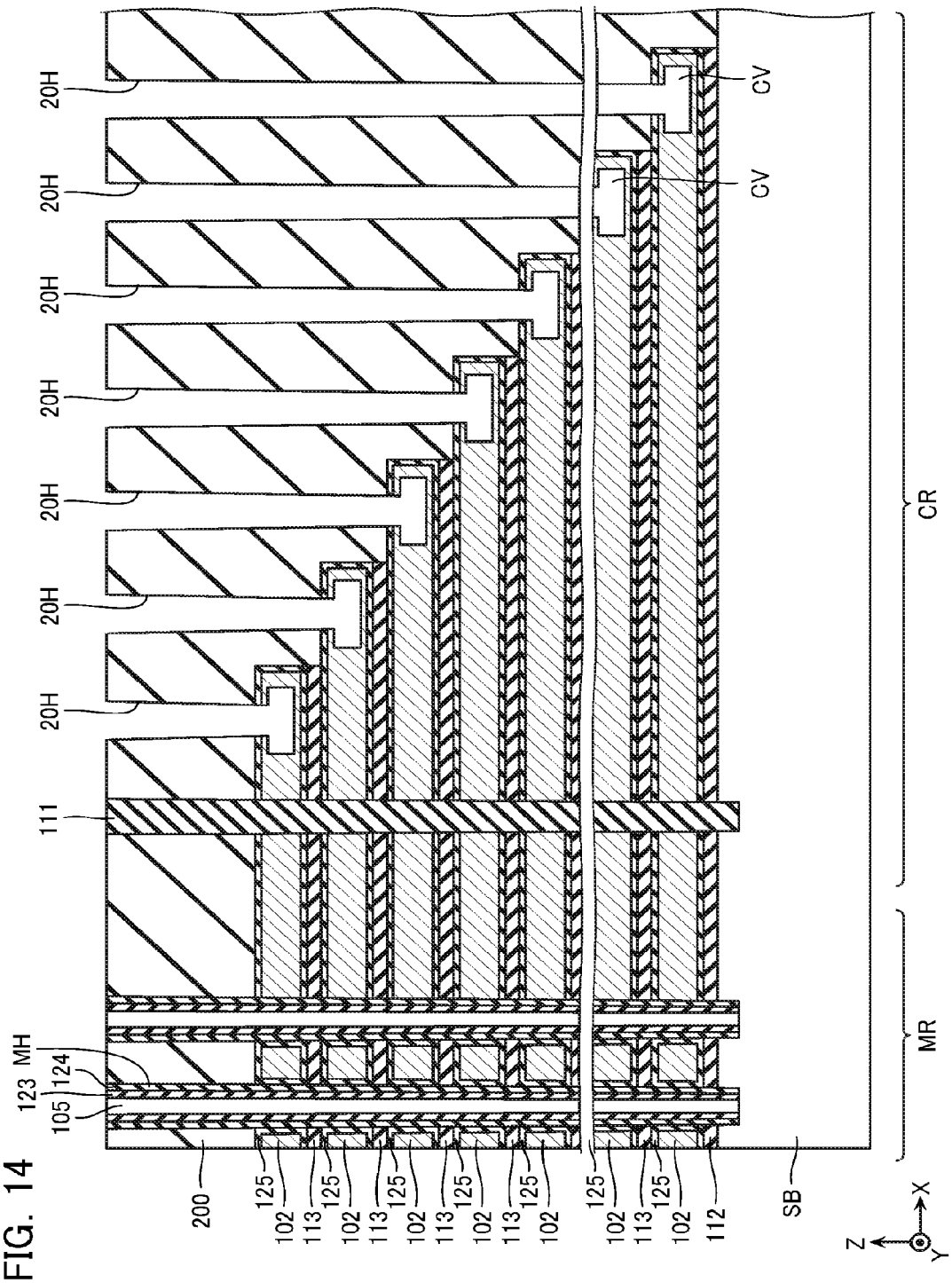
Figure 15:
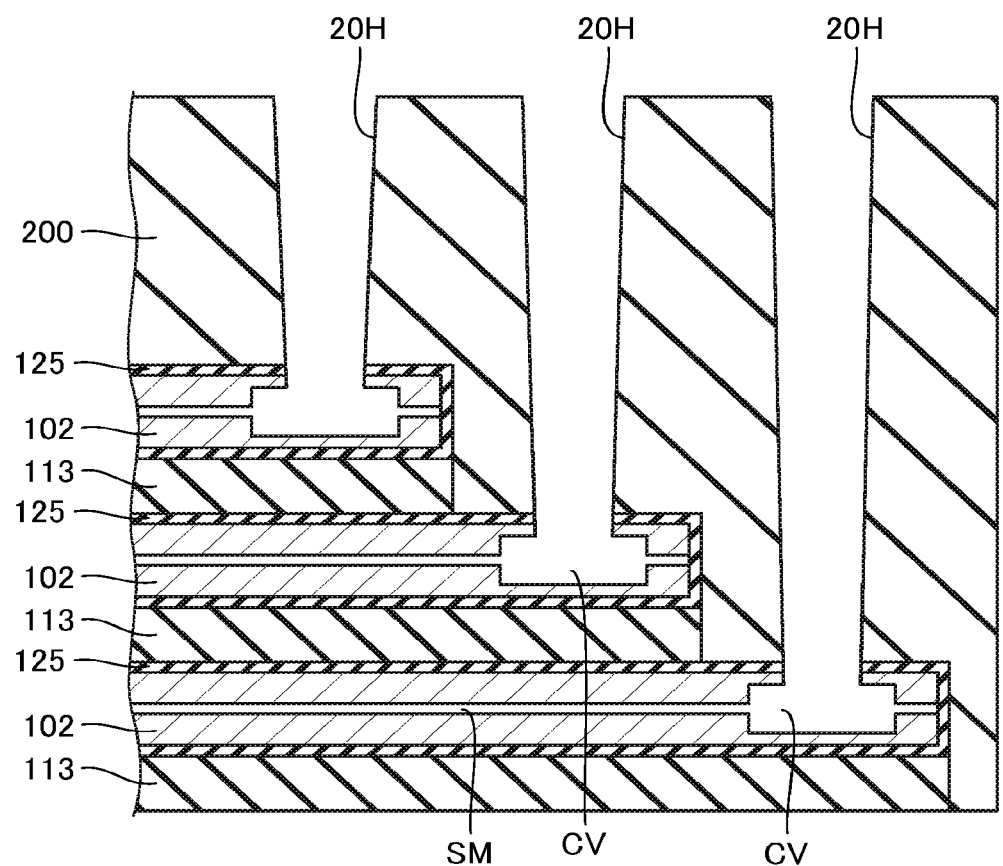

Next, as illustrated in FIG. 14, the wet etching is performed using an etching solution (hereinafter referred to as a choline-based solution), which is a mixture of, for example, choline $((CH_3)_3N(OH)CH_2CH_2OH)$, hydrogen peroxide, and water, to expand the width of the seams SM near the contact connection portions 102a, thus forming the void portions CV. As illustrated in the enlarged view in FIG. 15, the above-described choline-based solution reaches the seam SM via the through-hole 20H. This particularly progresses the etching of the seams SM near the lower ends of the through-holes 20H, thus forming the void portions CV as illustrated in FIG. 15.

Figure 16:
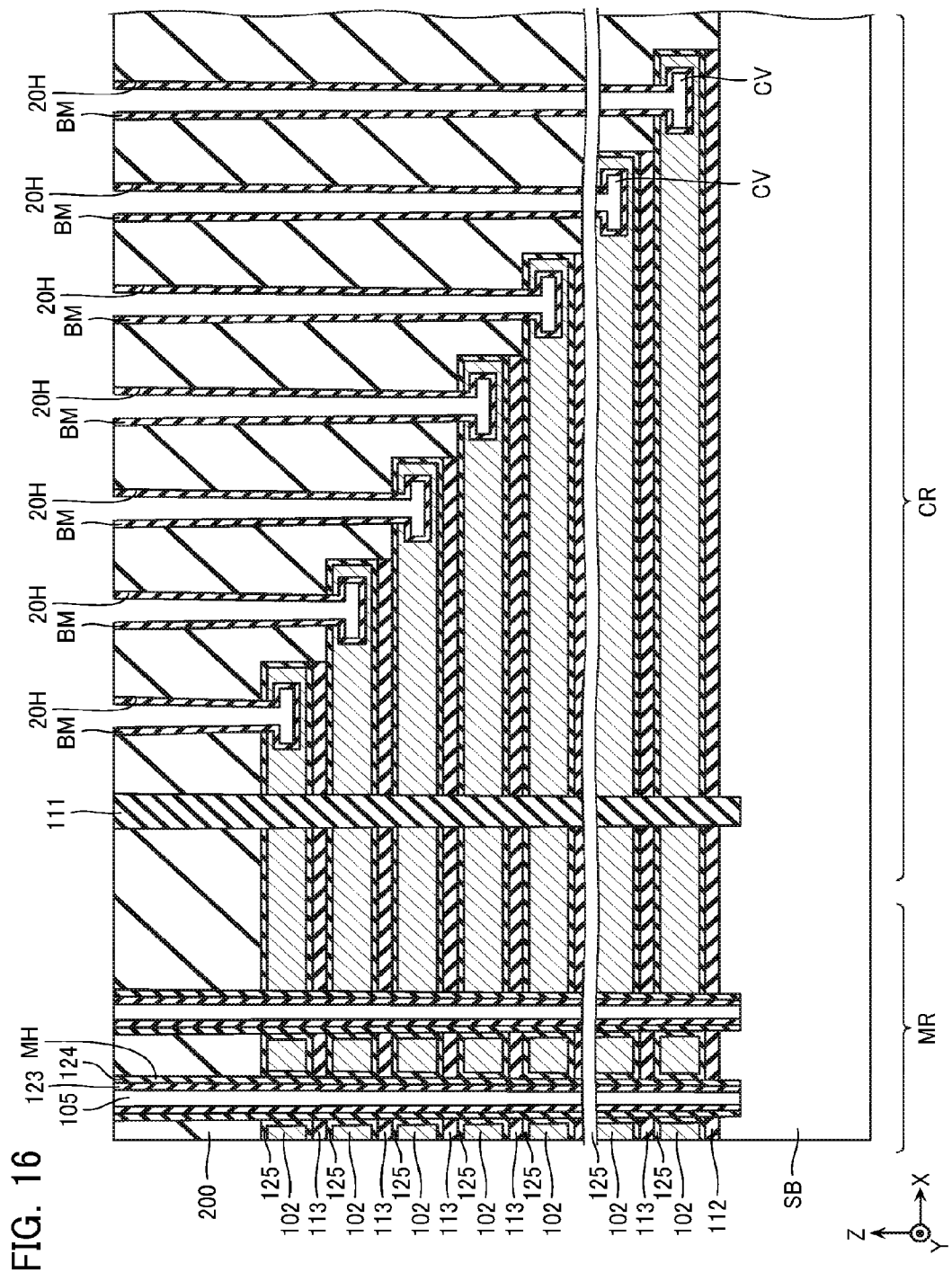
Figure 17:
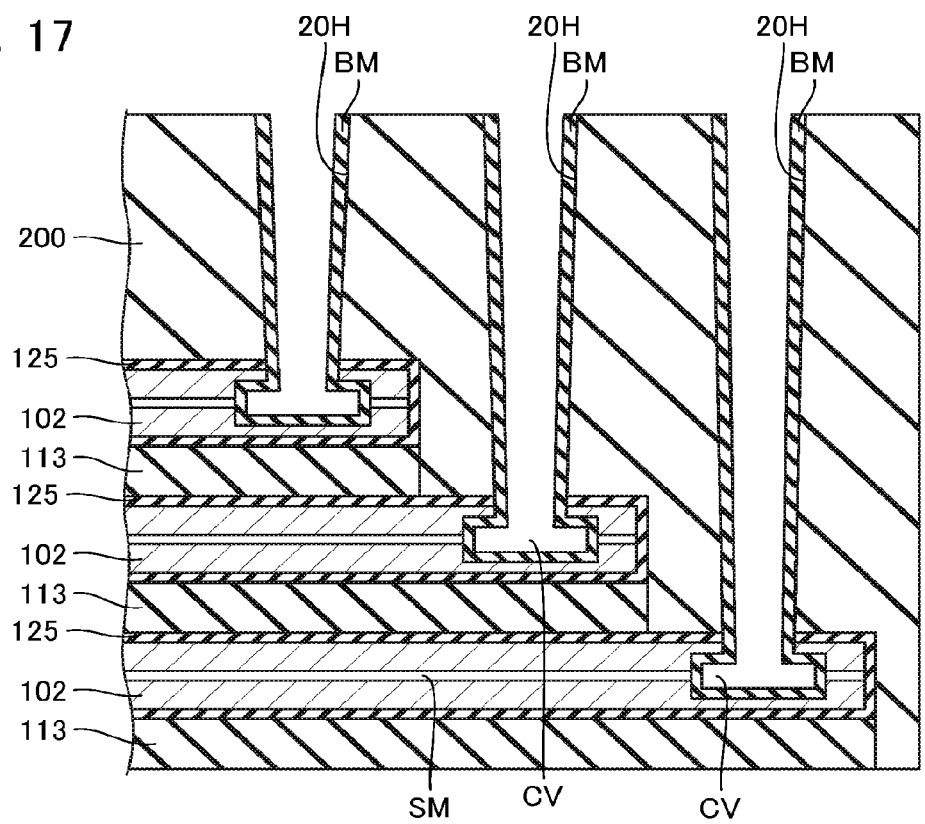
Figure 18:
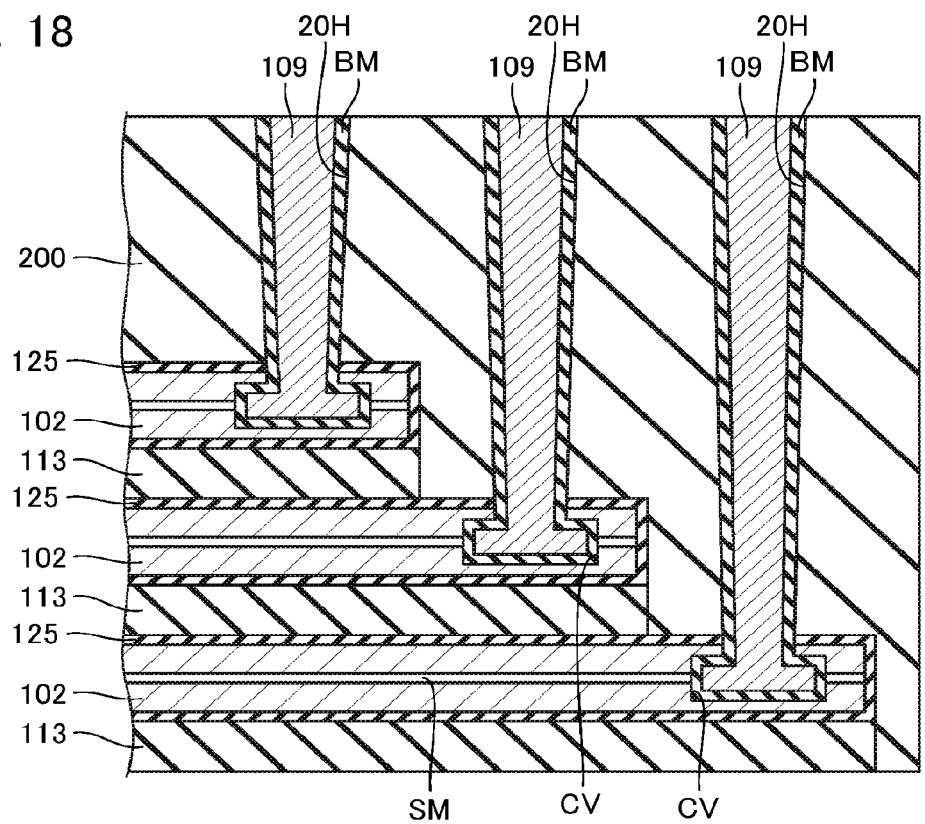

Next, as illustrated in FIG. 16, along the inner walls of the through-holes 20H and the void portions CV, the barrier metal films BM are formed using titanium nitride or a similar material as a material. The seams SM are usually formed having the width of around several nm. Accordingly, the barrier metal film BM is not formed on the inner wall of the seam SM but is formed only on the inner wall of the void portion CV and the inner wall of the through-hole 20H (see FIG. 17).

This completes the structure illustrated in FIG. 5 and FIG. 6.

As described above, with the semiconductor memory device according to this first embodiment, the contact plugs 109 include the first members 109A, which extend in the laminating direction, and the second members 109B, which extend in the direction intersecting with the laminating direction. This second member 109B is formed so as to be embedded into the void portion in the conductive layer 102. Since the top surface, the lower surface, and/or the side surfaces of the second member 109B can be in contact with the conductive layer 102, this structure allows reducing the contact resistance. This embodiment forms the void portions CV and expands the contacted area between the contact plug 109 and the conductive layer 102. This restrains the difference in the contact resistance among the plurality of conductive layers.

Modification of First Embodiment

Figure 19:
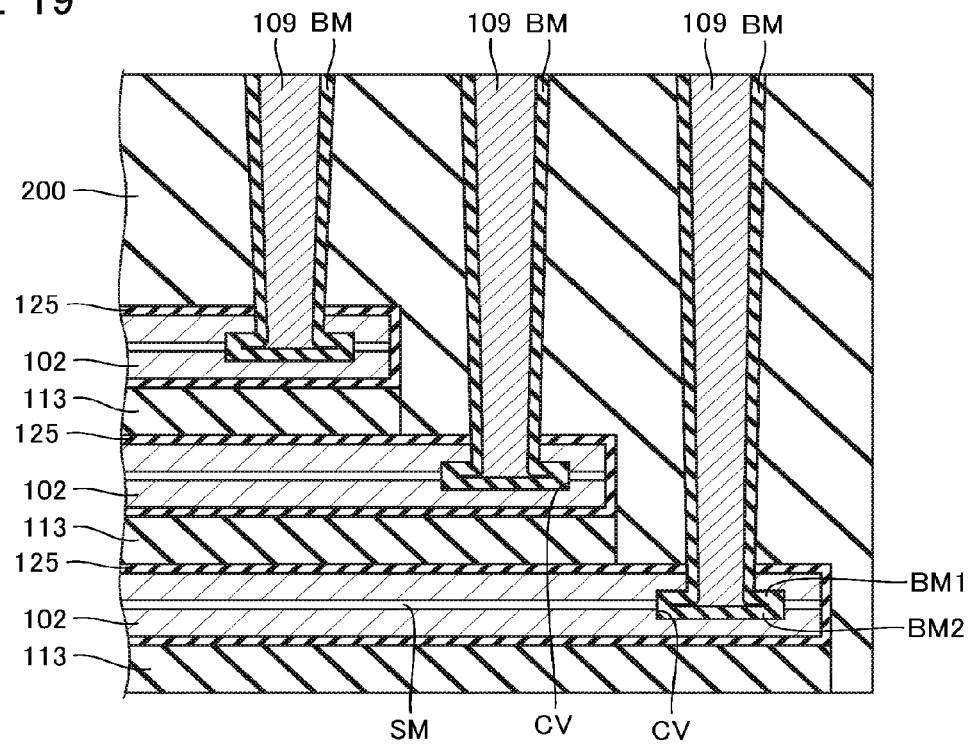
FIG. 19 is a cross-sectional view of illustrating a structure of a semiconductor memory device according to a modification of the first embodiment.

The following describes modifications of the first embodiment with reference to FIG. 19. In this modification, the end portion of the void portion CV is embedded only with the barrier metal film BM. In other words, the lower surface of a barrier metal film BM1 is in contact with a top surface of a barrier metal film BM2. The barrier metal film BM1 is deposited on the upper inner wall of the end portion of the void portion CV. The barrier metal film BM2 is deposited on the lower inner wall of the end portion of the void portion CV. The conductive layer 102 is not formed in a gap between the two layers of the barrier metal films BM1 and BM2. This modification forms at least a part of the second member 109B, which intersects with the first member 109A, only with the barrier metal film BM (BM1 and BM2). This modification also allows providing an effect similar to the first embodiment.

Second Embodiment

Figure 20:
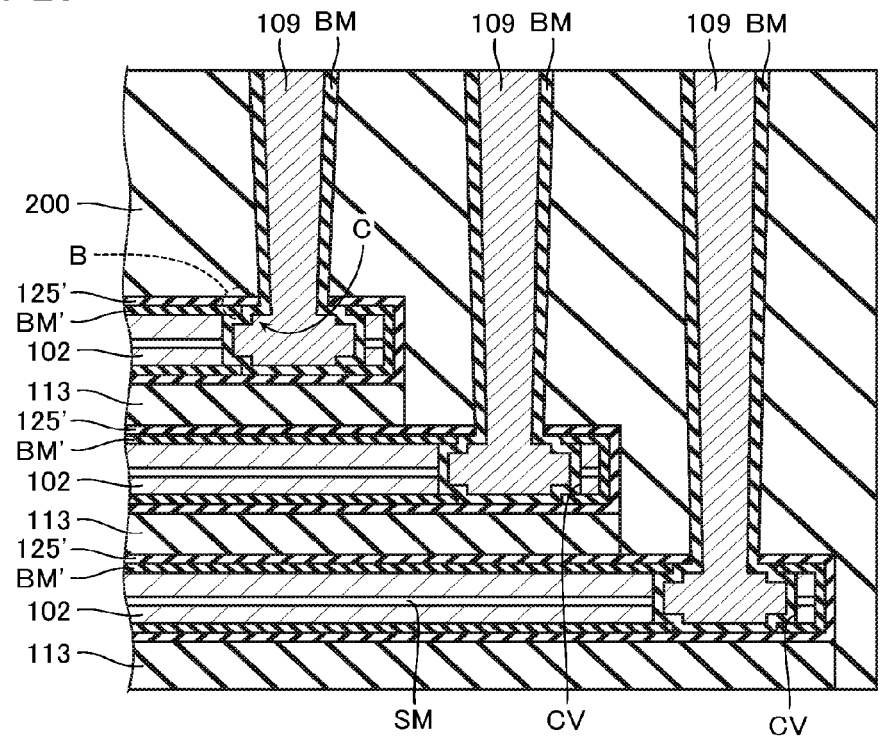
FIG. 20 is a cross-sectional view illustrating the structures of the contact plug 109 and the contact connection portion according to the second embodiment.
Figure 21:
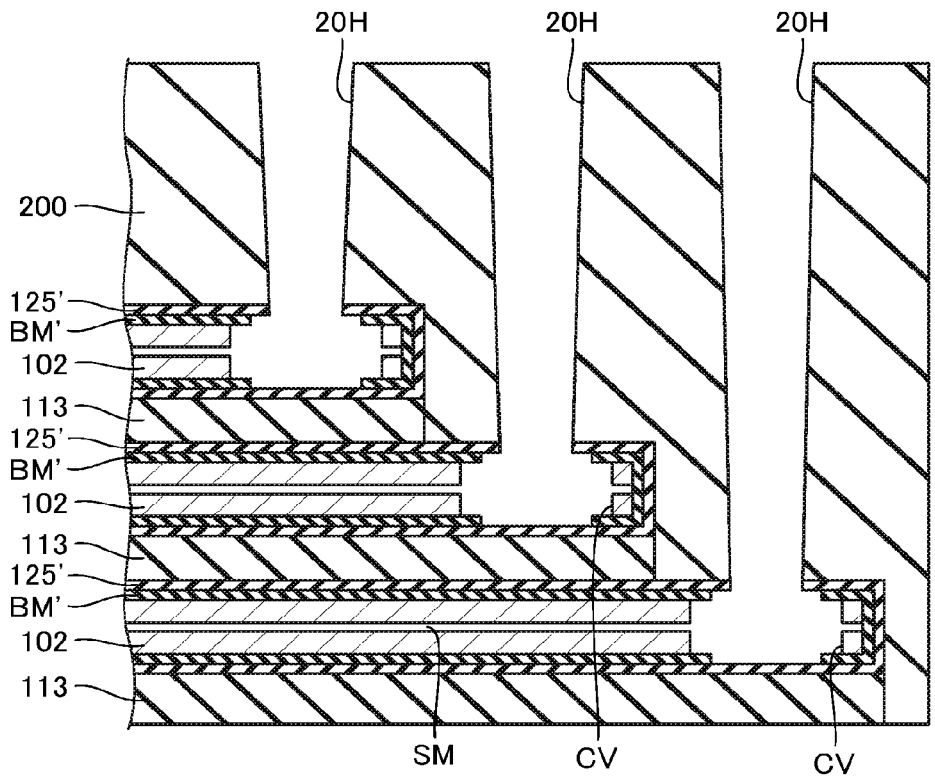
FIG. 21 and FIG. 22 are process drawings illustrating manufacturing processes of the semiconductor memory device according to the second embodiment.
Figure 22:
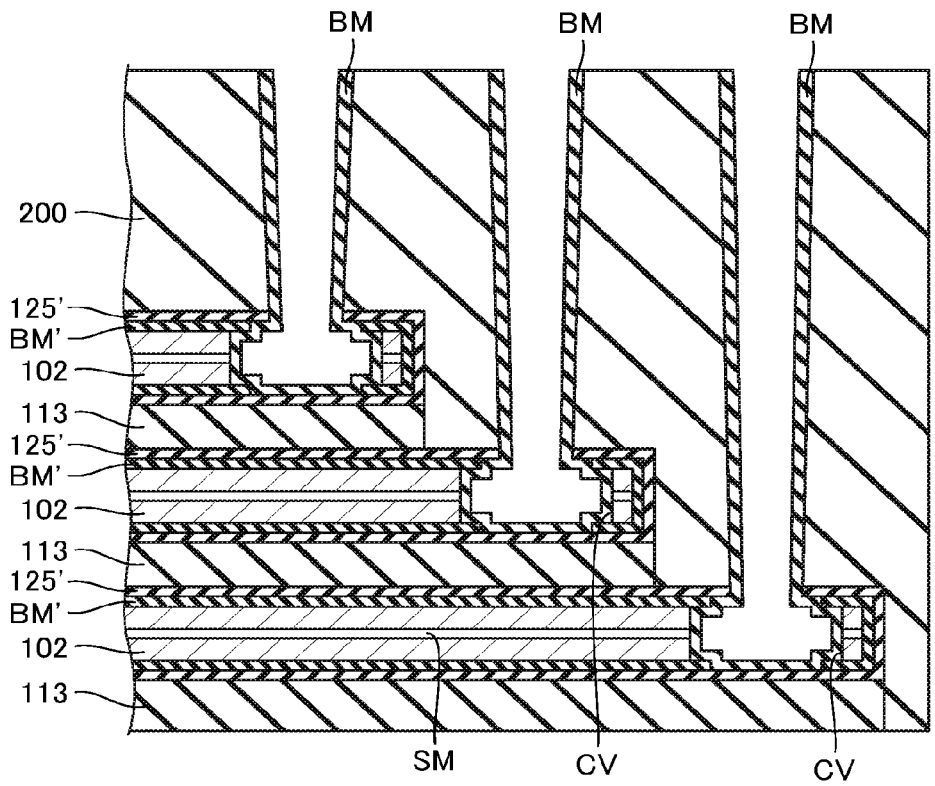

The following describes a semiconductor memory device according to the second embodiment with reference to FIG. 20 to FIG. 22. In this second embodiment, the overall structure is similar to that of the first embodiment (in FIG. 1 to FIG. 5). Therefore, the overlapped description will not be further elaborated here. However, this second embodiment differs from the first embodiment in the structures of the contact plug 109 and the contact connection portion. The following describes the differences with reference to FIG. 20.

FIG. 20 is a cross-sectional view illustrating the structures of the contact plug 109 and the contact connection portion according to the second embodiment. In this embodiment, a laminated film 125' and a barrier metal film BM' cover the peripheral area of the conductive layer 102. The laminated film 125' is an insulating film formed by laminating block insulating films, which are formed of an insulating film such as a silicon oxide film, and high-dielectric films, which are made of alumina ($Al_2O_3$), tantalum oxide ($Ta_2O_3$) or a similar material. Meanwhile, the barrier metal film BM' is made of titanium nitride or a similar material. However, viewed from the contact plug 109 side, the position of the end portion of the barrier metal film BM' retreats compared with the laminated film 125' (reference numeral B in FIG. 20). The second embodiment differs from the first embodiment in this respect. The barrier metal film BM, which covers the peripheral area of the contact plug 109, is also deposited on the position where this barrier metal film BM' is etch-backed (the position indicated by reference numeral B). Accordingly, the barrier metal film BM is formed so as to have a level difference in the laminating direction near the end portion of the barrier metal film BM' (the part indicated by reference numeral C in FIG. 20).

FIG. 21 and FIG. 22 illustrate manufacturing processes of the semiconductor memory device according to the second embodiment. The manufacturing processes from FIG. 8 to FIG. 13 may be identical to the first embodiment. Afterwards, for example, the wet etching using the choline solution expands that seams SM, thus forming the void portions CV. At this time, since the barrier metal film BM' has an etching rate close to the metal, which is the material of the conductive layer 102. Therefore, the amount of etching of the barrier metal film BM' is larger compared with the laminated film 125'. Accordingly, informing the void portion CV, the position of the end portion of the barrier metal film BM' retreats more than the laminated film 125' (see FIG. 21).

After that, as illustrated in FIG. 22, the barrier metal films BM are formed along the inner walls of the through-holes 20H and the void portions CV. At this time, the barrier metal film BM' retreats to the inside more than the laminated film 125'. Accordingly, the barrier metal film BM is deposited so as to have the level difference in the laminating direction at the inside of the void portion CV. After that, the metal film such as tungsten is deposited so as to embed the through-hole 20H and the void portion CV, thus forming the contact plug 109. This completes the structure illustrated in FIG. 20.

The above-described second embodiment can also provide effects similar to those in the first embodiment.

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above-described embodiments describe the case where the wiring portions, which are extraction wirings from the memory cell array in the three-dimensional NAND flash memory, are formed into the stepped pattern as an example. However, the present invention is not limited to this and is applicable to semiconductor memory devices of other types. Additionally, the wiring portions are also not limited to the stepped pattern. The present invention is also applicable to the general semiconductor memory devices that include the extraction wirings from the laminated conductive layers.

Figure 23:
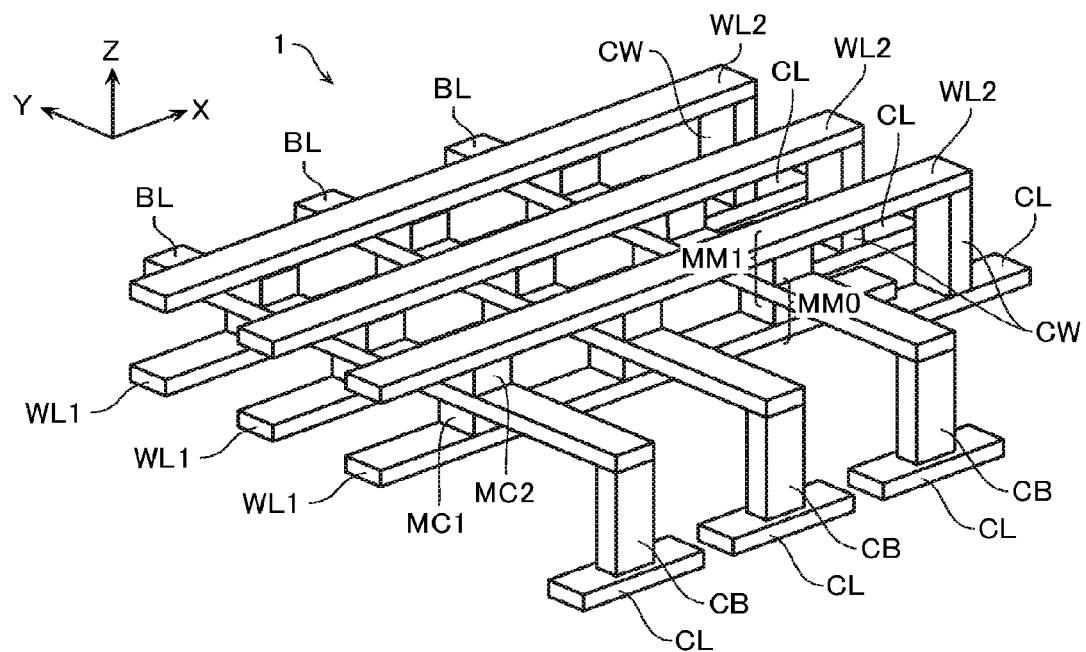
FIG. 23 illustrates a modification of the first and second embodiments.

FIG. 23 is a schematic perspective view of a semiconductor memory device according to a modification. The semiconductor memory device, which is illustrated in FIG. 23, is a so-called cross-point type resistance change memory. The semiconductor memory device includes resistance-change type memory cells MM1 and MM0, which are disposed at intersection points of the plurality of bit lines BL and the plurality of word lines WL. This modification does not form the end portions of the word lines WL and the bit lines BL into the stepped pattern. The word line WL and the bit line BL connect to contacts CW and CB, which extend from the end portions of the word line WL and the bit line BL to downward, respectively. The lower ends of the contact CW and the contact CB connect to lower layer wirings CL. The contacts CW and CB and the lower layer wirings can be constituted similarly to the contact plug 109 and the conductive layer 102 of the above-described embodiments.

What is claimed is:
1. A semiconductor memory device, comprising:
 a plurality of first conductive layers disposed above a substrate in a laminating direction;
 a wiring portion that includes a second conductive layer electrically connected to the first conductive layer, the second conductive layer having an end portion as a contact connection portion; and
 a contact plug connected to the contact connection portion, the contact plug including a first member that extends in the laminating direction and a second mem- ber that extends in a direction intersecting with the laminating direction inside the contact connection portion;

a first barrier metal film being disposed between the contact plug and the second conductive layer:

a second barrier metal film that covers a peripheral area of the second conductive layer; and an insulating film that covers the peripheral area of the second conductive layer via the second barrier metal film, wherein an end portion of the second barrier metal film is at a position retreated compared with an end portion of the insulating film viewed from the contact plug.

2. The semiconductor memory device according to claim 1, wherein the first barrier metal film is disposed at peripheral areas of the first member and the second member, while the first barrier metal film is not disposed at a portion where the first member connects to the second member.

3. The semiconductor memory device according to claim 1, wherein at least a part of the second member is constituted of two layers of first barrier metal films, the first barrier metal films being in contact with one another in the laminating direction.

4. The semiconductor memory device according to claim 1, wherein the first barrier metal film has a level difference in the laminating direction near the end portion of the second barrier metal film.

5. The semiconductor memory device according to claim 1, wherein the second member has a length along a longitudinal direction greater than a diameter of a lower end of the first member.

6. The semiconductor memory device according to claim 1, wherein the first member and the second member are made of an identical material.

7. The semiconductor memory device according to claim 1, wherein the wiring portion includes a stepped shape portion, the stepped shape portion having end portions of the second conductive layers, the end portions having positions different from one another in a longitudinal direction.

8. The semiconductor memory device according to claim 7, wherein diameters of lower ends of the plurality of contact plugs becomes smaller as positions thereof in the laminating direction lowers.

9. The semiconductor memory device according to claim 7, wherein the first barrier metal film is disposed at peripheral areas of the first member and the second member, the first barrier metal film being absent at a portion where the first member connects to the second member.

10. The semiconductor memory device according to claim 7, wherein at least a part of the second member is constituted of two layers of first barrier metal films, the first barrier metal films being in contact with one another in the laminating direction.

* * * * *